United States Patent
O'Riordan et al.

(10) Patent No.: US 9,020,277 B1
(45) Date of Patent: Apr. 28, 2015

(54) IMAGE-BASED STIMULUS FOR CIRCUIT SIMULATION

(71) Applicant: Cadence Design Systems, Inc., San Jose, CA (US)

(72) Inventors: Donald J O'Riordan, Sunnyvale, CA (US); David Varghese, Kochi (IN)

(73) Assignee: Cadence Design Systems, Inc., San Jose, CA (US)

( * ) Notice: Subject to any disclaimer, the term of this patent is extended or adjusted under 35 U.S.C. 154(b) by 232 days.

(21) Appl. No.: 13/666,414

(22) Filed: Nov. 1, 2012

(51) Int. Cl.
*G06K 9/46* (2006.01)
*G06K 9/00* (2006.01)

(52) U.S. Cl.
CPC .................. *G06K 9/0053* (2013.01)

(58) Field of Classification Search
CPC ..... G06K 9/186; G06K 9/00791; G06K 9/03; G06T 7/0075; G06T 2207/30148; G06T 5/001
USPC .......... 382/207, 106, 149, 167, 227
See application file for complete search history.

(56) References Cited

U.S. PATENT DOCUMENTS

| | | | |
|---|---|---|---|
| 2007/0198967 A1* | 8/2007 | Ren et al. | 716/21 |
| 2012/0016652 A1* | 1/2012 | Stamoulis et al. | 703/14 |

OTHER PUBLICATIONS

"Bitmap", Wikipedia, (Sep. 24, 2012 accessed), 3 pgs.
"C Preprocessor", Wikipedia, http://en.wikipedia.org/wiki/C_preprocessor, (Jun. 16, 2011 accessed), 17 pgs.
"ECE Software", UC Davis Department of Electrical and Computer Engineering, http://www.ece.ucdavis.edu/cad/hspice/sci.electronics.cad-spice.html, (Jun. 14, 2011 accessed), 6 pgs.
"Edge Detection", Wikipedia, (Sep. 21, 2012 accessed), 8 pgs.
"Grayscale", Wikipedia, (Sep. 21, 2012 accessed), 4 pgs.
"Imagine gradient", Wikipedia, (Sep. 21, 2012 accessed), 4 pgs.
"Netlist", Wikipedia, http://en.wikipedia.org/wiki/Netlist, (Aug. 15, 2011 accessed), 3 pgs.
"PHP", Wikipedia, http://en.wikipedia.org/w/index.php?title=PHP&printable=yes, (Aug. 17, 2011 accessed), 10 pgs.
"Prewitt operator", Wikipedia, (Sep. 17, 2012 accessed), 3 pgs.
"Python (Programming Language)", Wikipedia, http://en.wikipedia.org/wiki/Python_(programming_language), (Aug. 17, 2011 accessed), 14 pgs.
"SPICE (Simulation Program with Integrated Circuit Emphasis)", Wikipedia, http://en.wikipedia.org/wiki/SPICE, (Aug. 15, 2011 accessed), 7 pgs.

* cited by examiner

*Primary Examiner* — Ruiping Li
(74) *Attorney, Agent, or Firm* — Kenyon & Kenyon LLP

(57) ABSTRACT

Certain embodiments enable image-based stimulus for circuit simulations by extracting a waveform from an image and using that waveform to simulate a circuit. Image-processing aspects may include edge-detection processes to identify a boundary of the waveform in the image.

21 Claims, 22 Drawing Sheets

```
1  // Library name: MFINV
   // Cell name: inv
   // View name: schematic
   subckt inv A Y
5    PM0 (Y A vdd! vdd!) gpdk090_pmos1v w=(120n) l=100n as=69.6f ad=40.8f \
         ps=1.16u pd=680n m=(1)*(2)
     NM0 (Y A 0 0) gpdk090_nmos1v w=(120n) l=100n as=69.6f ad=40.8f \
         ps=1.16u pd=680n m=(1)*(2)
   ends inv
10 // End of subcircuit definition.
```

FIG. 2

```
V2 (vdd! net03) vsource dc=0 type=dc
V0 (Input 0) vsource dc=3 type=pulse val0=0 val1=5 period=100u rise=1n \
    fall=1n width=50u
V1 (net03 0) vsource dc=5 type=dc
```

FIG. 3

```
 1  V2 (vdd! net03) vsource dc=0 type=dc

//V0 (Input 0) vsource dc=3 type=pulse val0=0 val1=5 period=100u rise=1n \
    //      fall=1n width=50u
 5
    <?python
    import sys
    sys.path.append("/servers/scratch02/davidv/inv/netlist")
    from Image2XY import PWLGen
10  pgen = PWLGen('scope.gif', 'gs3.png', 'bw3.ppm', 'vector.txt', '2e-03', '200e-03')
    print "V0 (Input 0) vsource type=pwl wave=",
    pgen.create_pwl()
    ?>

15  V1 (net03 0) vsource dc=5 type=dc
```

FIG. 9

```
1   // Library name: solutions
    // Cell name: supply
    // View name: schematic
    subckt supply VDD VSS
5   parameters VDD VSS
        V0 (VDD 0) vsource dc=VDD type=dc
        V2 (VSS 0) vsource dc=VSS type=dc
    ends supply
    // End of subcircuit definition.
10  1
    // Library name: solutions_new
    // Cell name: amplifier
    // View name: schematic
    subckt amplifier inm inp iref out inh_bulk_n
15      C0 (net7 out) capacitor c=CAP
        R0 (net18 net7) resistor r=2.5K
        Q4 (out iref vdd! inh_bulk_n) kpnp
        Q2 (iref iref vdd! inh_bulk_n) kpnp
        Q3 (net29 iref vdd! inh_bulk_n) kpnp
20      M5 (gnode gnode vss! vss!) nch w=100u l=10u
        M2 (net18 gnode vss! vss!) nch w=100u l=10u
        M1 (net18 inp net29 vdd!) pch w=(8u)*16 l=8u
        M3 (gnode inm net29 vdd!) pch w=128u l=(128u)/16
        Q1 (net39 vss! inh_bulk_n) knpn
25      Q0 (out net18 net39 inh_bulk_n) knpn
    ends amplifier
    // End of subcircuit definition.
```

FIG. 12

```
1   //V2 (vin 0) vsource mag=1 type=sine sinedc=0 ampl=1m freq=1k
    // instantiate a voltage source, which generates a PWL waveform
    // as determined by an JPG input file
    <?python
5   import sys
    sys.path.append("/home/riordan/python/tmp/DavidNetlist")
    from image2XY import PWLGen
    pgen = PWLGen('sinelkh_test.jpg', 'gs.png', 'bw.ppm', 'vector.txt', '2e-3', '2e-3')
    print "V2 (vin 0) vsource type=pwl wave=",
10  pgen.create_pwl()
    ?>
```

FIG. 15

```
1  //V2 (vin 0) vsource mag=1 type=sine sinedc=0 ampl=1m freq=1k
   // instantiate a voltage source, which generates a PWL waveform
   // as determined by an JPG input file
   // output begin <code object <module> at 0x2a98818e40, file "<string>", line 1>
5  V2 (vin 0) vsource type=pwl wave= [ 0.000004 0.000055 \
   0.000008 0.000040 \
   0.000012 0.000050 \
   0.000016 0.000080 \
   0.000020 0.000095 \
10 0.000024 0.000130 \

... snipped ...

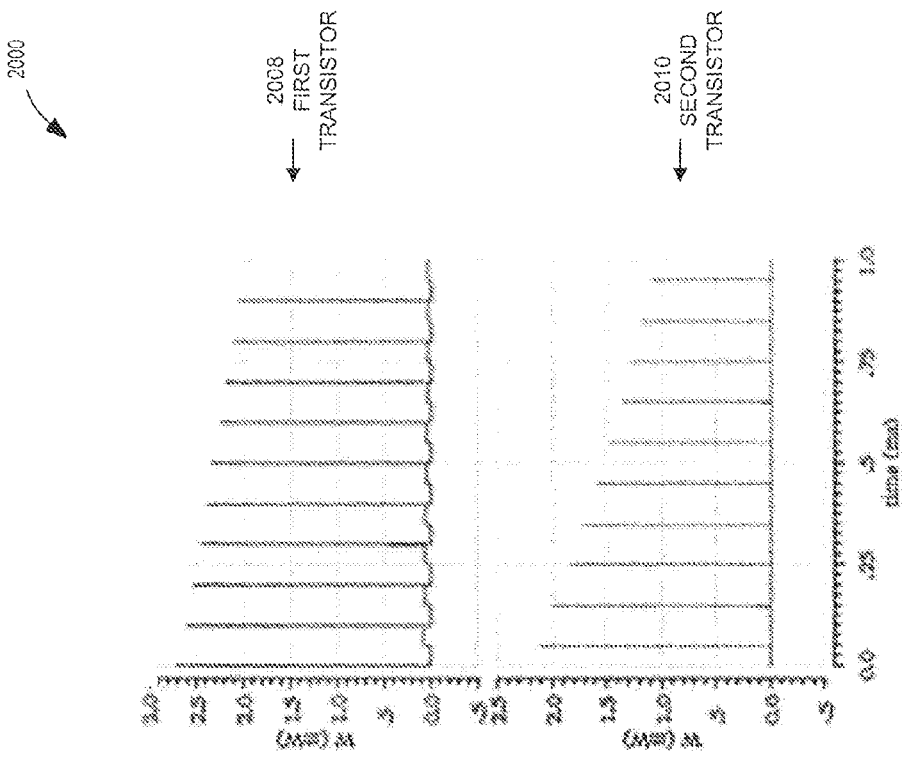
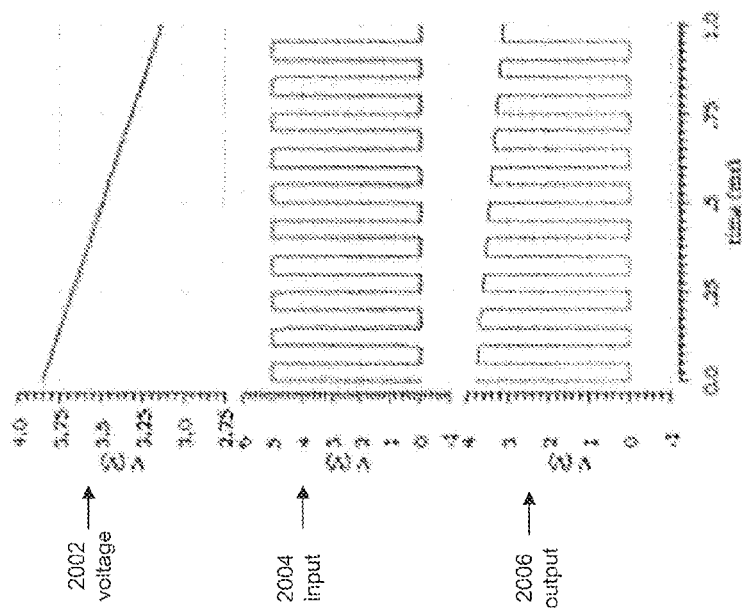
FIG. 20

IMAGE-BASED STIMULUS FOR CIRCUIT SIMULATION

FIELD

The present disclosure relates generally to computing and more particularly to computer simulations of circuits.

BACKGROUND

Circuit simulators typically operate on netlist code that describes the circuit model and specifies the simulation conditions. For example, the circuit model typically includes model elements (e.g., transistors), parameters (e.g., process/device), and connectivity (e.g., topology), and the simulation conditions typically include model inputs for the simulation interval including waveform profiles for inputs and power supplies. However, related software for simulating circuits has typically not enabled direct imaged-based inputs (e.g., bitmap images) even though image-based representations may be available or easily generated to capture relevant behavioral characteristics of circuit stimulus. Thus, there is a need for improved methods and related systems for enabling circuit simulations with image-based stimulus.

SUMMARY

Certain embodiments enable image-based stimulus for circuit simulations by extracting a waveform from an image and using that waveform to simulate a circuit.

One embodiment relates a method of using an image as an input for simulating a circuit. A first operation includes accessing image values for the image, the image characterizing a stimulus profile for the circuit over time, and the image values including to a two-dimensional array of pixel values for the image. A second operation includes extracting a sequence of time values and stimulus values for the stimulus profile from the image values, the time values being scaled by a time-scale value for a first dimension of the image, the stimulus values being scaled by a stimulus-scale value for a second dimension of the image, and the stimulus values corresponding to voltages or currents for the stimulus profile. A third operation includes providing the sequence of time values and stimulus values as an input waveform for simulating the circuit.

Another embodiment relates to an apparatus for carrying out any one of the above-described methods, where the apparatus includes a computer for executing instructions related to the method. For example, the computer may include a processor for executing at least some of the instructions. Additionally or alternatively the computer may include circuitry or other specialized hardware for executing at least some of the instructions. In some operational settings, the apparatus may be configured as a system that includes one or more units, each of which is configured to carry out some aspects of the method either in software, in hardware or in some combination thereof. At least some values for the results of the method can be saved for later use in a computer-readable medium, including memory units and storage devices. Another embodiment relates to a computer-readable medium that stores (e.g., tangibly embodies) a computer program for carrying out the any one of the above-described methods with a computer. In these ways aspects of the disclosed embodiments enable circuit simulations with image-based stimulus.

BRIEF DESCRIPTION OF DRAWINGS

Some embodiments are illustrated by way of example and not limitation in the figures of the accompanying drawings.

FIG. 2 is a listing of a code segment that shows a netlist description for the inverter in the inverter-circuit testbench of FIG. 1.

FIG. 3 is a listing of a code segment that shows example voltage inputs for the inverter-circuit testbench of FIG. 1.

FIG. 9 is a listing of a code segment that shows example voltage inputs for the inverter-circuit testbench of FIG. 1 in accordance with an example embodiment.

FIG. 12 is a listing of a code segment that shows a netlist description for the amplifier in the amplifier-circuit testbench of FIG. 11.

FIG. 15 is a listing of a code segment that shows example voltage inputs for the amplifier-circuit testbench of FIG. 11 in accordance with an example embodiment.

FIG. 16 is a listing of a code segment that shows example voltage inputs for the amplifier-circuit testbench of FIG. 11 after pre-processing the code segment of FIG. 15 in accordance with an example embodiment.

FIG. 20 is a diagram that shows a waveform display related to the inverter-circuit testbench of FIG. 1 including a voltage waveform, an input waveform, an output waveform, a first transistor waveform, and a second transistor waveform 2010.

DETAILED DESCRIPTION

Example methods and systems are directed to circuit simulation. The disclosed examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Figure 1:
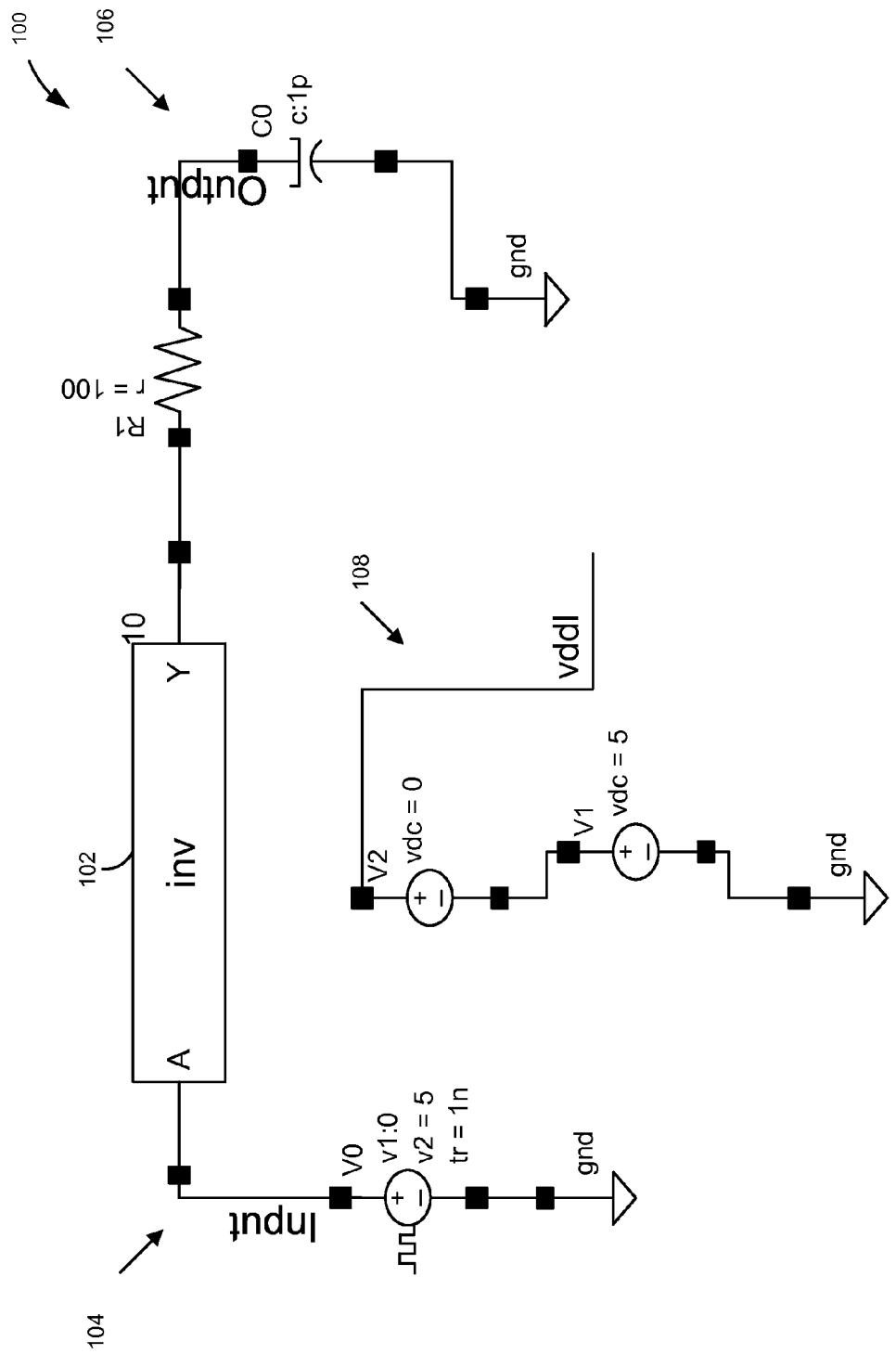
FIG. 1 is a diagram that shows an inverter-circuit testbench for an example embodiment.

FIG. 1 is a diagram that shows an inverter-circuit testbench 100 for an example embodiment. As shown in FIG. 1, the inverter-circuit testbench 100 includes an inverter 102 with input elements 104, output elements 106 and a power supply 108. Circuit simulators (e.g., e.g., SPECTRE or SPICE language-based simulators) typically employ software descriptions of the testbench 100 in order to simulate the behavior of the inverter 104 under a variety of conditions. The relevant input deck for the circuit simulator typically includes: process and device parameters and models representing the manufacturing process, the topology of the circuit to be simulated/verified, the types of analyses that are of interest (transient, ac, dc etc), a list of voltage/current node probing points under analyses for waveform generation/measurements, and appropriate stimuli which can test the functionality of the circuit For example, FIG. 2 is a listing of a code segment that shows a corresponding netlist description for the inverter 102 including a first transistor PM0 (lines 5-6) and a second transistor NM0 (lines 7-8). (Note that words such as first and second are used here and elsewhere for labeling purposes only and are not intended to denote any specific spatial or temporal ordering. Furthermore, the labeling of a first element does not imply the presence a second element.)

Figure 4:
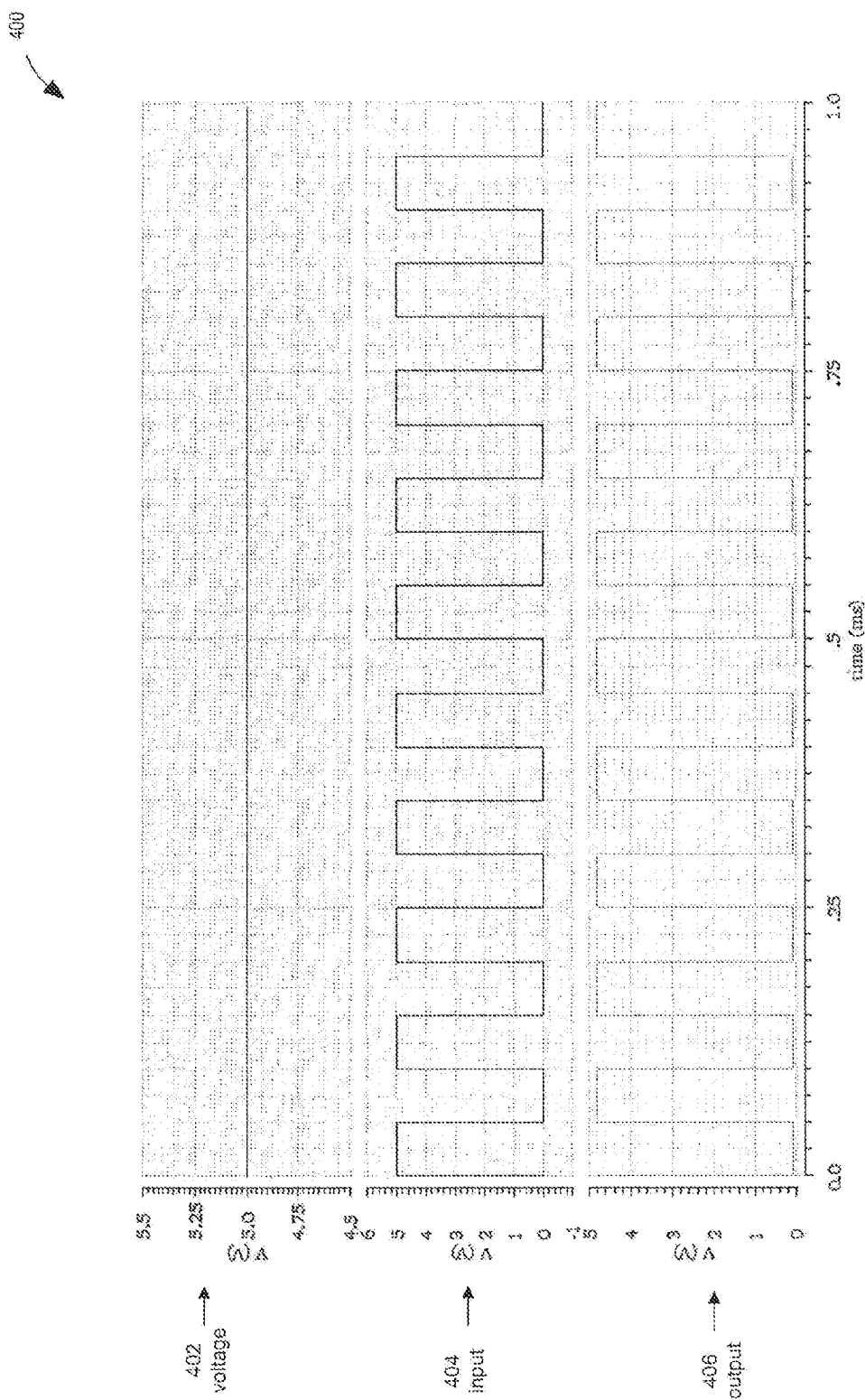
FIG. 4 is a diagram that shows a waveform display related to the inverter-circuit testbench of FIG. 1 including a voltage waveform, an input waveform, and an output waveform.

FIG. 3 is a listing of a code segment that shows example voltage inputs for the inverter-circuit testbench 100 including constant voltages V1 (line 4) and V2 (line 1), which correspond to the power supply 108, and a voltage input V0 that is defined as an ideal pulse waveform that switches between 0V and 5V with additional arguments including period, rise time, fall time, and width. FIG. 4 is a diagram that shows a corresponding waveform display 400 for the inverter-circuit testbench 100 of FIG. 1 including a voltage waveform 402 for the power-supply voltage V1 (e.g., FIG. 3, line 4), an input waveform 404 for the voltage input V0 (e.g., FIG. 3, lines 2-3), and a corresponding output waveform 406. For example, with reference to FIG. 1, the input waveform 404 may correspond to values at node A of the inverter 102 and the output waveform 406 may correspond to values at node Y of the inverter 102.

The simulation shown in FIG. 4 characterizes behavior of the inverter 102 the absence of non-idealistic effects including noise in the input waveform 404 and the voltage waveform 404. Although an idealistic simulation can verify fundamental properties of a circuit, the introduction of noise and other non-idealistic effects is becoming increasingly important as performance requirements have become increasingly stringent. For example, with greater process variations in small-geometry processes coupled with related issues such as power-grid voltage drops that affect local power voltages, circuit reliability for critical circuits is now being verified under a variety of adverse conditions where the inputs to the circuit deviate substantially from the ideal conditions.

Responding to these enhanced requirements, designers have tried to model various effects and encapsulate them to modify otherwise ideal stimuli that drive circuit inputs or power supplies. Typical approaches have included parasitics-based Resistance-Capacitance (RC) modeling, transmission line modeling, input and output voltage source noise modeling, substrate noise modeling, IR (voltage) drop modeling, and so forth.

In the context of behavioral modeling, the designer can approximately model the behavior of complex stimuli (e.g., using Verilog-A, or other similar behavioral description languages) in order to analyze the circuit response. However, the behavior of complex stimuli is often difficult to model accurately. Although N-degree polynomial approximations have been used successfully in some applications, the modeling requirements impose a substantial burden on the designer.

More accurate models have also been derived through real-time probing of a fabricated circuit under test combined with subsequent data-characterization. For example, some designers extensively use high-end oscilloscopes to probe the test chip in order to model difficult characteristics such as substrate noise behavior (e.g., in a high speed mixed signal chip) by using the current data as an input for the next chip. While this gives designers a more intuitive visualization of the actual input vector shape, this approach incurs both cost and difficulty in transferring the scoped characteristics to the simulation testbench.

As discussed below, example embodiments enable a designer to use image data as an input for simulating a circuit, where this image may correspond to measured circuit data (e.g., oscilloscope data) or more general user input such as an image drawing tool (e.g., MS Paint, GIMP, etc.).

Figure 5:
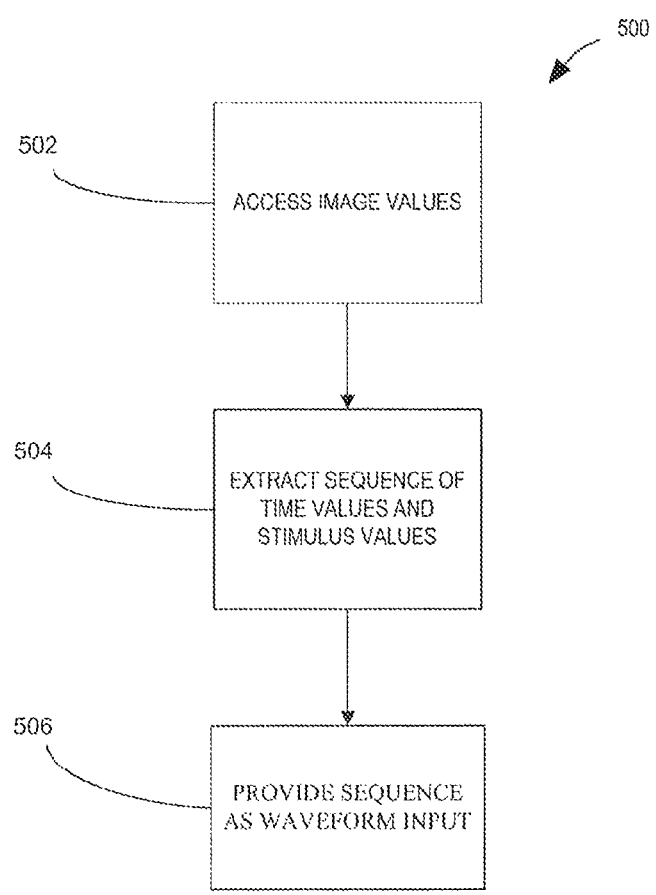
FIG. 5 is a flowchart that shows a method of using an image as an input for simulating a circuit according to an example embodiment.

FIG. 5 is a flowchart that shows a method 500 of using an image as an input for simulating a circuit according to an example embodiment. A first operation 502 includes accessing image values for the image, where the image characterizes a stimulus profile for the circuit over time, and the image values include a two-dimensional array of pixel values for the image. A second operation 504 includes extracting a sequence of time values and stimulus values for the stimulus profile from the image values, where the time values are scaled by a time-scale value for a first dimension of the image, the stimulus values are scaled by a stimulus-scale value for the second dimension of the image, and the stimulus values correspond to voltages or currents for the stimulus profile. A third operation 506 includes providing the sequence of time values and stimulus values as an input waveform for simulating the circuit.

Accessing the image values (e.g., operation 502) may include scanning a display of the image to determine the image values. For example, a conventional image scanning device operating on the display (e.g., a bitmap image) may return a two-dimensional array of pixel values for the image in a variety of formats (e.g., multi-colored, grayscale, black and white). The image may be a single snapshot or a series of snapshots (e.g., stitched together). As discussed above, the image may be measurement-based (e.g., a snapshot of an oscilloscope) or more generally based on user input (e.g., a drawing tool). Expert designers often intuitively know the general shape of the relevant input waveforms and can conveniently draw the waveform profile with a drawing program and then connect the drawing to the circuit by providing appropriate scale factors (e.g., the time-scale factor and the stimulus-scale factor).

Figure 6:
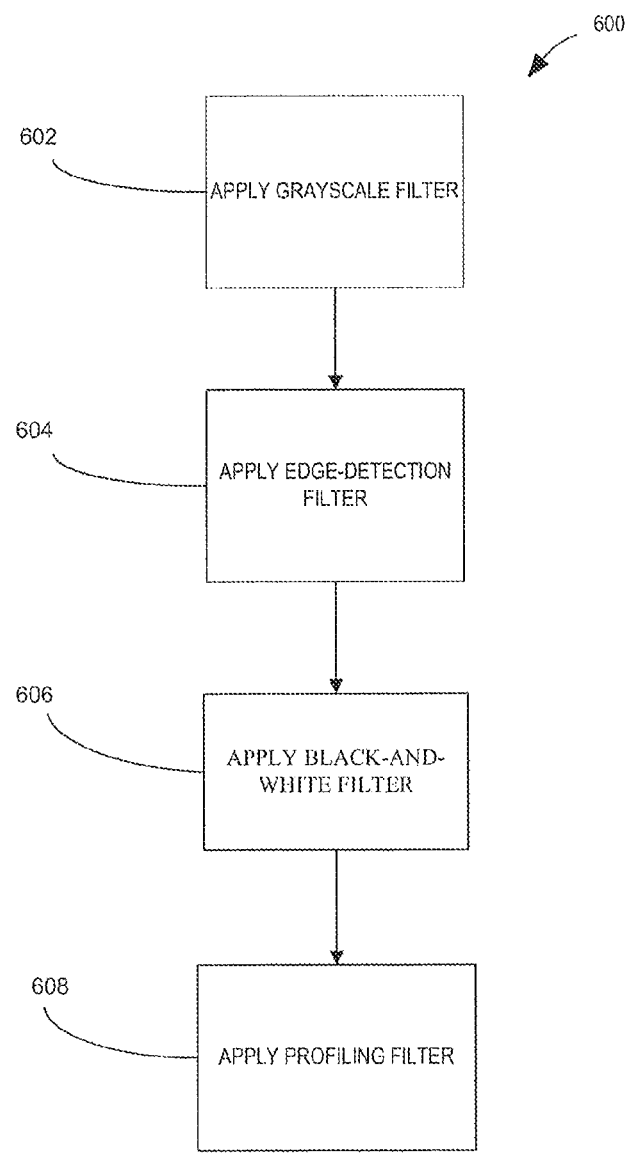
FIG. 6 is a flowchart that shows a method of extracting a sequence of time values and stimulus values for the embodiment of FIG. 5.

As discussed below in greater detail, extracting the sequence of time values and stimulus values may include a combination of image processing methods. FIG. 6 is a flowchart that shows a method 600 of extracting a sequence of time values and stimulus values for an example embodiment of operation 504 in FIG. 5. A first operation 602 includes applying a grayscale filter to the image values to determine first grayscale image values for the image by comparing one or more grayscale threshold values to the image values, where the first grayscale image values include a two-dimensional array of first grayscale pixel values. A second operation 604 includes applying an edge-detection filter to the first grayscale image values to determine second grayscale image values for the image by calculating transitions between the first grayscale image values, where the second grayscale image values include a two-dimensional array of second grayscale pixel values. A third operation 606 includes applying a black-and-white filter to the second grayscale image values to determine black-and-white image values for the image by comparing one or more black-and-white threshold values to the second grayscale image values, where the black-and-white image values include a two-dimensional array of black-and-white pixel values that each correspond to black or white. A fourth operation 608 includes applying a profiling filter to the black-and-white image values to extract the sequence of time values and stimulus values by identifying black-and-white pixel values that correspond to the stimulus profile in the black and white. The time-scale value and the stimulus-scale value then provide the scaling connection to circuit.

Figure 7:
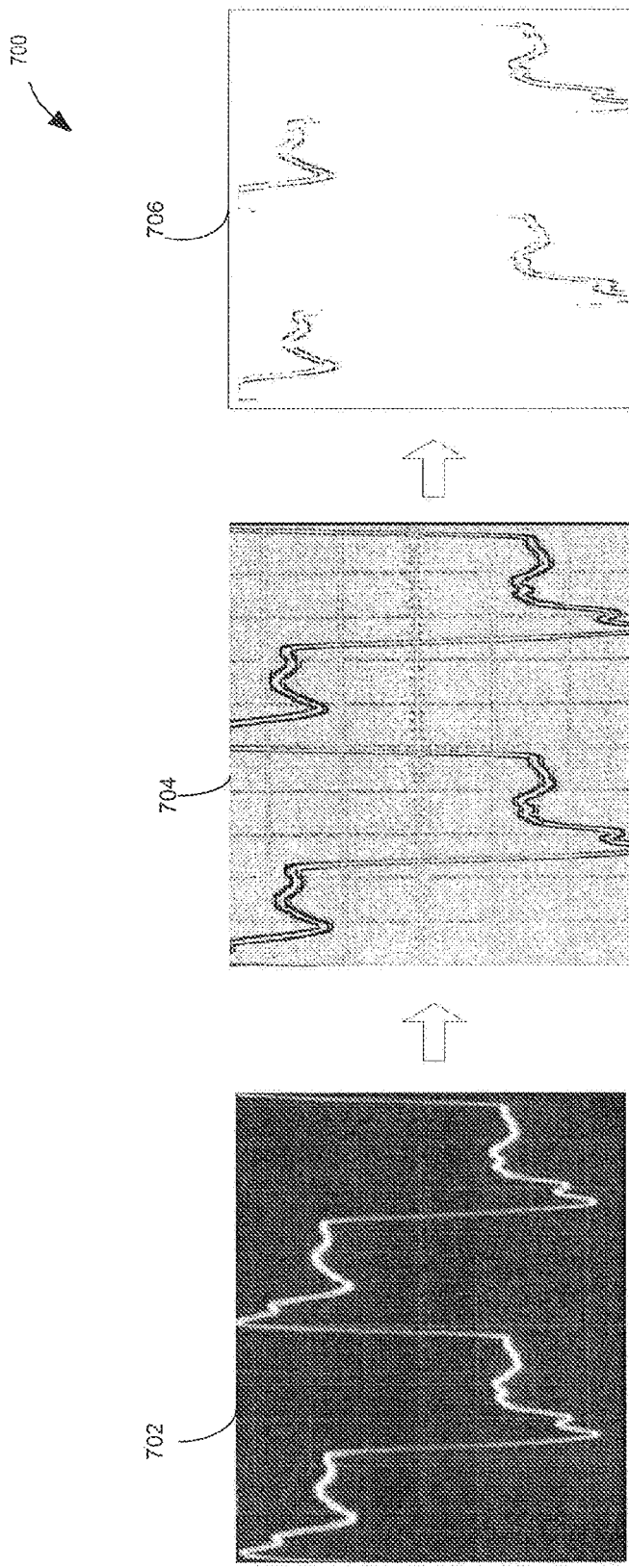
FIG. 7 is a process diagram that shows image transformations from a display image to a grayscale image after edge detection and to a black-and-white image.

Although FIG. 6 shows four filter stages, the number and arrangement of filters may vary according to the nature of the image data. FIG. 7 is a process diagram 700 that shows image transformations for an example embodiment from a display image 702 to a grayscale image 704 after edge detection and a black-and-white image 706. In this example embodiment, the display image 702 corresponds to an oscilloscope voltage display, which is typically multi-colored. The grayscale image 704 may then be the result of a using a grayscale filter (e.g., operation 602) to replace multiple colors with grayscale colors plus an edge-detection filter (e.g., operation 604) to emphasize the likely boundary of the waveform in the display image 702. For example, the edge-detection filter may operate to identify pixel-value transitions that correspond to a boundary of the stimulus profile, and subsequently these pixel-value transitions may be used to identify the time values and stimulus values corresponding to the stimulus profile. For example, the edge-detection filter may use a difference operator (e.g., a Prewitt operator) to estimate the gradient of the image intensity function in order to identify maximal pixel-value transitions. Note that this example assumes a zero-crossing line in the display image 702 so that there is an approximately even split above and below a central horizontal line that corresponds to a zero value in the display image 702. However, depending on the operational setting, the user may employ a user interface to set a zero or non-zero reference value on the vertical scale of the display image 702, and similarly the user may set a reference value on the horizontal scale of the display image 702 (e.g., for a reference time value).

When an edge-detection filter is applied after a grayscale filter or combined with a grayscale filter, the grayscale filter may determine grayscale image values for the image by comparing one or more grayscale threshold values to the image values, where the grayscale image values include a two-dimensional array of grayscale pixel values. Then, the edge-detection filter operates to identify transitions in the grayscale pixel values to identify the boundary of the stimulus profile. The black-and-white image 706 may then result from using a black-and-white filter (e.g., operation 606) that applies threshold values to restrict each pixel value to black or white.

Finally the sequence of time values and stimulus values can be extracted from the black-and-white image 706 by using a profiling filter (e.g., operation 608) that identifies the underling profile (e.g., as a black pixel). Two points should be emphasized. First, black-and-white image 706 may include multiple stimulus values for a given time value because the edge-detection filter has identified both an upper boundary and a lower boundary for the underlying profile (e.g., as in grayscale mage 704). Therefore, the profiling filter may include a monotonicity filter that that restricts the sequence to be monotonic in the time values. For example in the case of two stimulus values for a given time, the lower stimulus value corresponding to the lower boundary may be selected. Alternatively, the higher stimulus value may be chosen or an average value may be chosen.

Figure 8:
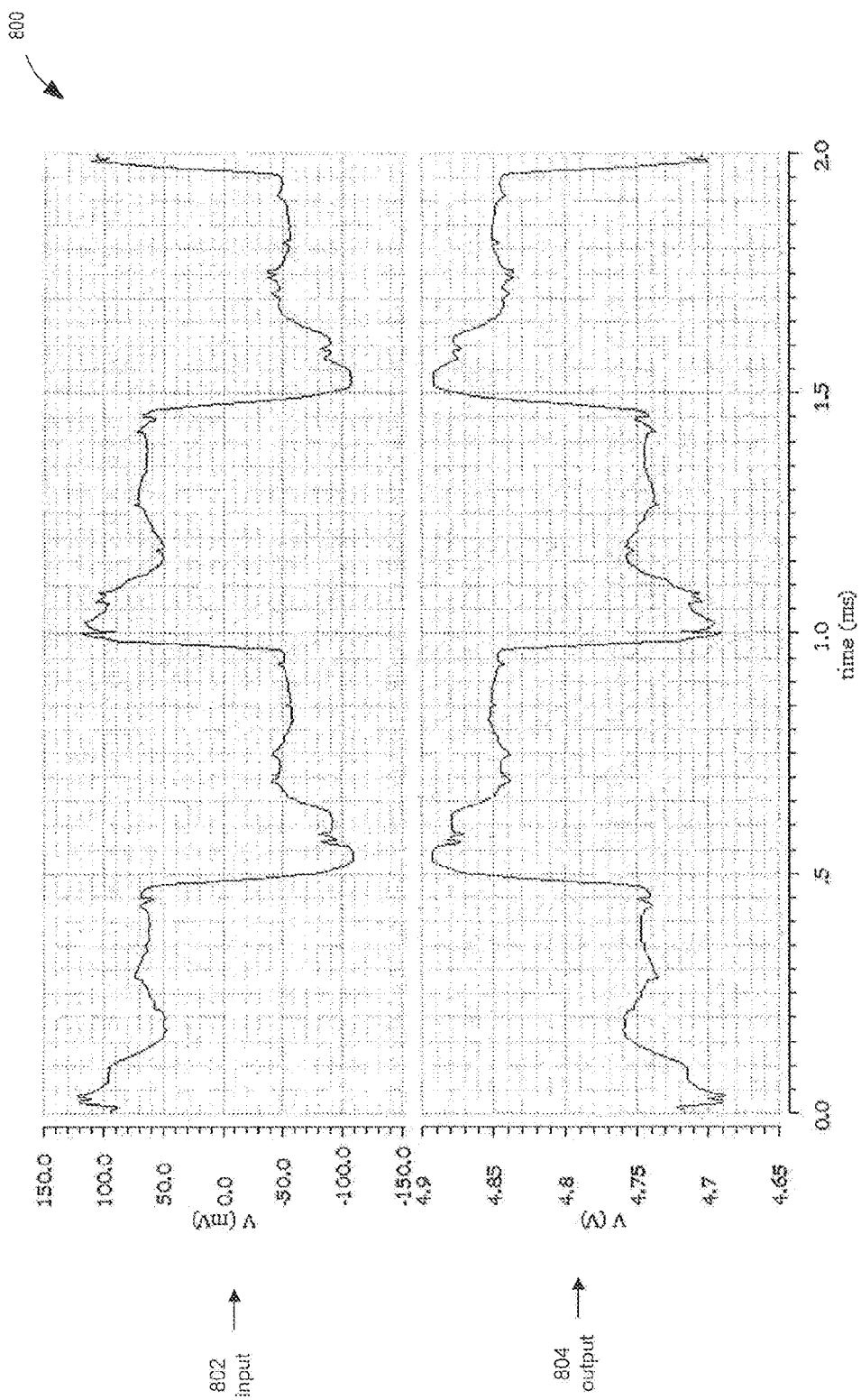
FIG. 8 is a diagram that shows a waveform display related to the inverter-circuit testbench of FIG. 1 including an input waveform and an output waveform.

Second, the resulting sequence may be missing a stimulus value for a given time value because of the threshold values used or other filtering details. For example, the black-and-white image 706 appears to be ragged, especially at transitions between high voltage values and low voltage values. Additional resolution can be added adaptively by changing filter values to identify missing points (e.g., adjusting threshold values until a stimulus value is identified). However, it is generally sufficient to rely on a linear interpolation between the identified points. FIG. 8 is a diagram that shows a waveform display 800 related to the inverter-circuit testbench 100 of FIG. 1 including an input waveform 802 that corresponds to a piece-wise linear interpolation of the profile extracted from the black-and-white image 706. The corresponding output waveform 804 is also shown.

Providing the sequence of time values and stimulus values as an input waveform (e.g., operation 506) may include adding the sequence to a netlist description for simulating the circuit as a piecewise-linear waveform that interpolates the time values and the stimulus values. As illustrated in FIG. 9, conventional simulators (e.g., SPECTRE or SPICE language-based simulators) enable the piecewise-linear interpolation of waveform data as an input to a circuit simulation, and the extracted sequence data can be provided to the simulator through operations of conventional scripting languages (e.g., Python and PHP).

FIG. 9 is a listing of a Python-based code segment that shows example voltage inputs for the inverter-circuit testbench 100 of FIG. 1 in accordance with an example embodiment. Comparing FIG. 9 with FIG. 3, one can see that the original pulse waveform (lines 2-3, FIG. 3) has been replaced with a Python script (lines 6-13, FIG. 9). In particular line 10 of FIG. 9 indicates to apply the image captured in the file "scope.gif" as an input stimulus V0 that is characterized as a piece-wise linear source with a peak-to-peak voltage of 200 mv [200e-03](e.g., a stimulus-scale value) over a transient time of 2 ms [2e-03](e.g., a time-scale value). Here, "PWL-Gen" represents a Python class that wraps the function called "Image2XY," which implements an image processing algorithm in order to convert the graphical image stored in file "scope.gif" into a XY voltage-time pair piecewise-linear (PWL) source suitable for use in the circuit simulator. Related intermediate values are also shown including grayscale image values ("gs3.png"), black-and-white image values ("bw3.png"), and a record of the time values and stimulus values for debugging purposes ("vector.txt."). Python-language operations on lines 11-12 of FIG. 9 then generate a sequence of time values and stimulus values for circuit simulation.

Programming languages can be used to generate netlist code for circuit simulation by using language preprocessors that implement embedded code segments (e.g., FIG. 9) as described in U.S. application Ser. No. 13/270,052, filed Oct. 10, 2011, entitled "Chained Programming Language Preprocessors for Circuit Simulation," and which is incorporated herein by reference in its entirety.

Figure 10:
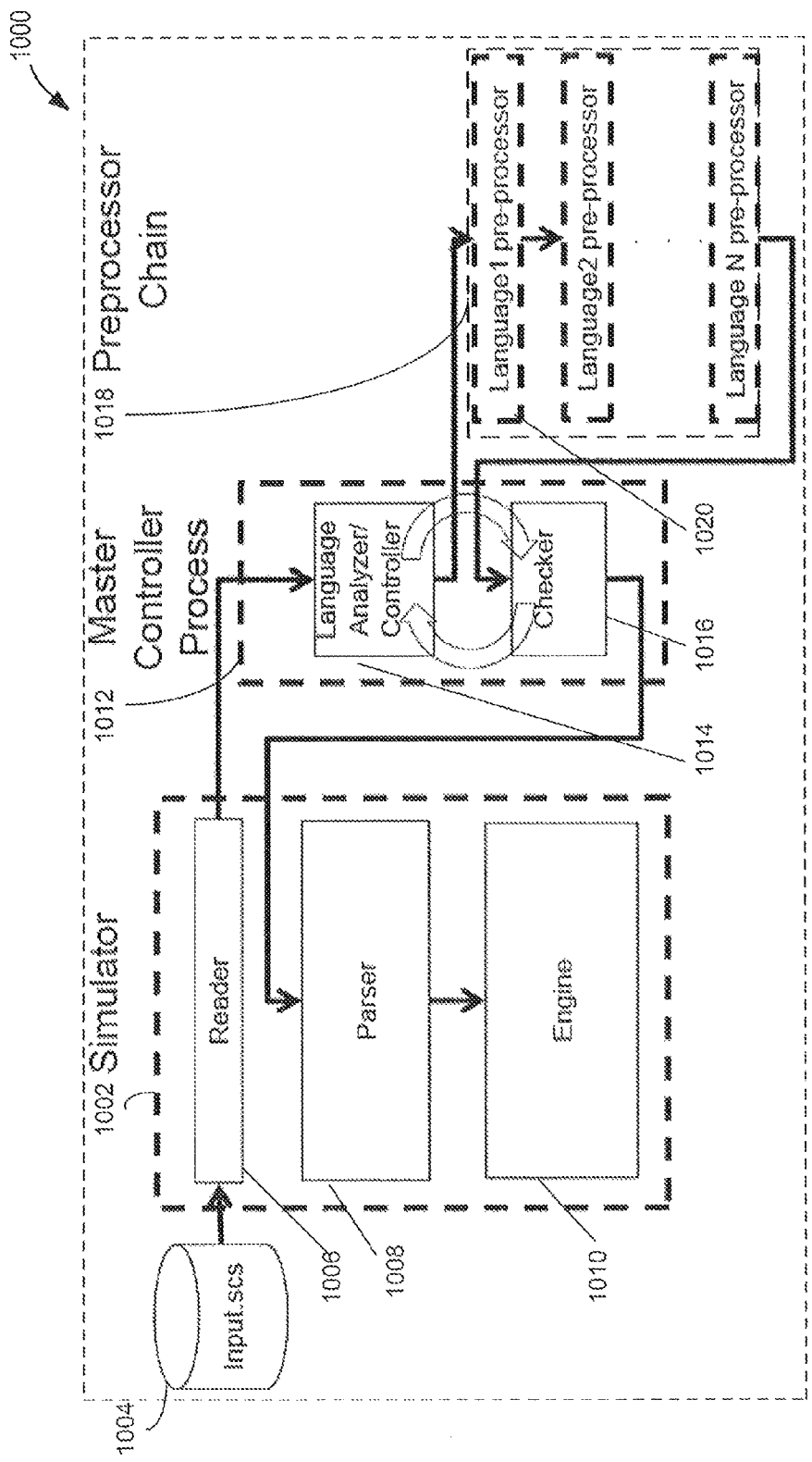
FIG. 10 is a diagram that shows a circuit simulation system in accordance with an example embodiment.

FIG. 10 is a diagram that shows a circuit simulation system 1000 that incorporates programming language functionality including scripting operations that enable the generation of executable netlist code in accordance with an example embodiment. These scripting operations may include internal variables (e.g., to be evaluated for different circuit options), control structures (e.g., if-then-else statements, execution loops), external access (e.g., to a repository site via the Internet). Programming structures may also incorporate advanced features from Object Oriented Programming such as data abstraction, encapsulation, messaging, modularity, polymorphism, and inheritance.

For example, referencing an external site through a Uniform Resource Identifier (URI) can enable access to circuit models in specific netlist languages (e.g., SPICE). Similarly, referencing an external site can enable the creation of a stimulus whose voltage or current waveform tracks the results of a previous simulation of the same or a different circuit. Control structures can be used to create parameterized topology generators for model elements (e.g., a parameterized cell (PCell)). Control structures can also be used to create an analysis generator (or option generator) that is capable of performing analysis loops, a desirable feature that is generally unavailable in netlist languages, in order to obtain a range of node voltages or to run an arbitrary loop-based analysis sequence.

The system includes a simulator 1002 that receives an input file 1004 that includes a netlist description that can be more general than executable netlist code. That is, the input file 1004 may include embedded code segments written in programming languages that include scripting operations for generating executable netlist code (e.g., as in FIG. 9). The simulator includes a reader 1006 that reads in the input file 1004, a parser 1008 that determines the netlist elements by extracting them from the file and converting them into tokens, and a simulation engine 1010 that simulates the circuit based on extracted network elements or their equivalent tokens. Additionally the system 1000 includes a master controller process 1012 that includes a language analyzer/controller 1014 and a checker 1016. The language analyzer/controller 1014 analyzes the input file 1004 to identify the embedded code segments and their corresponding programming languages, which preferably have been specified or registered in the system 1000 for this purpose.

As embedded code segments are identified by the language analyzer/controller, the master controller process 1012 configures a preprocessor chain 1018, also described as a pipeline preprocessor, that includes a language preprocessor 1020 for each identified programming language. That is, each preprocessor reads from its standard input (stdin) and writes to its standard output (stdout), and the preprocessors are arranged in a sequence so that the standard output of one preprocessor is the standard input of the next processor in the sequence. Each preprocessor operates on embedded code segments written in its corresponding programming language to generate corresponding preprocessed code segments that are written to its standard output. Additionally, each preprocessor writes other portions of the netlist description directly (e.g., verbatim) to its standard output including netlist code as well as embedded code segments that are not written in its corresponding programming language.

As a result, the netlist description corresponding to the input file 1004 can be sequentially processed by the components of the preprocessor chain 1018 to replace the embedded code segments with preprocessed segments. These preprocessed segments may be entirely executable netlist code or may include further embedded code segments.

The checker 1016 then evaluates the output from the preprocessor chain 1018 to determine if additional embedded code segments are present (e.g. as a result of executing an embedded code segment). If additional embedded code segments are detected by the checker 1016, then the operations of the language analyzer/controller 1014 and the preprocessor chain can be repeated until the checker 1016 detects executable netlist code with no embedded code segments. That is, when the checker 1016 detects at least one embedded code segment in the output buffer of the preprocessor chain 1018, the output buffer of the checker 1016 is directed to the language analyzer/controller 1014 for further processing through the preprocessor chain 1018. Finally, when the checker 1016 detects no more embedded code segments 1016 in the output buffer of the preprocessor chain 1018, the output buffer of the checker 1016 is directed to the parser 1008 and the engine 1010.

Figure 11:
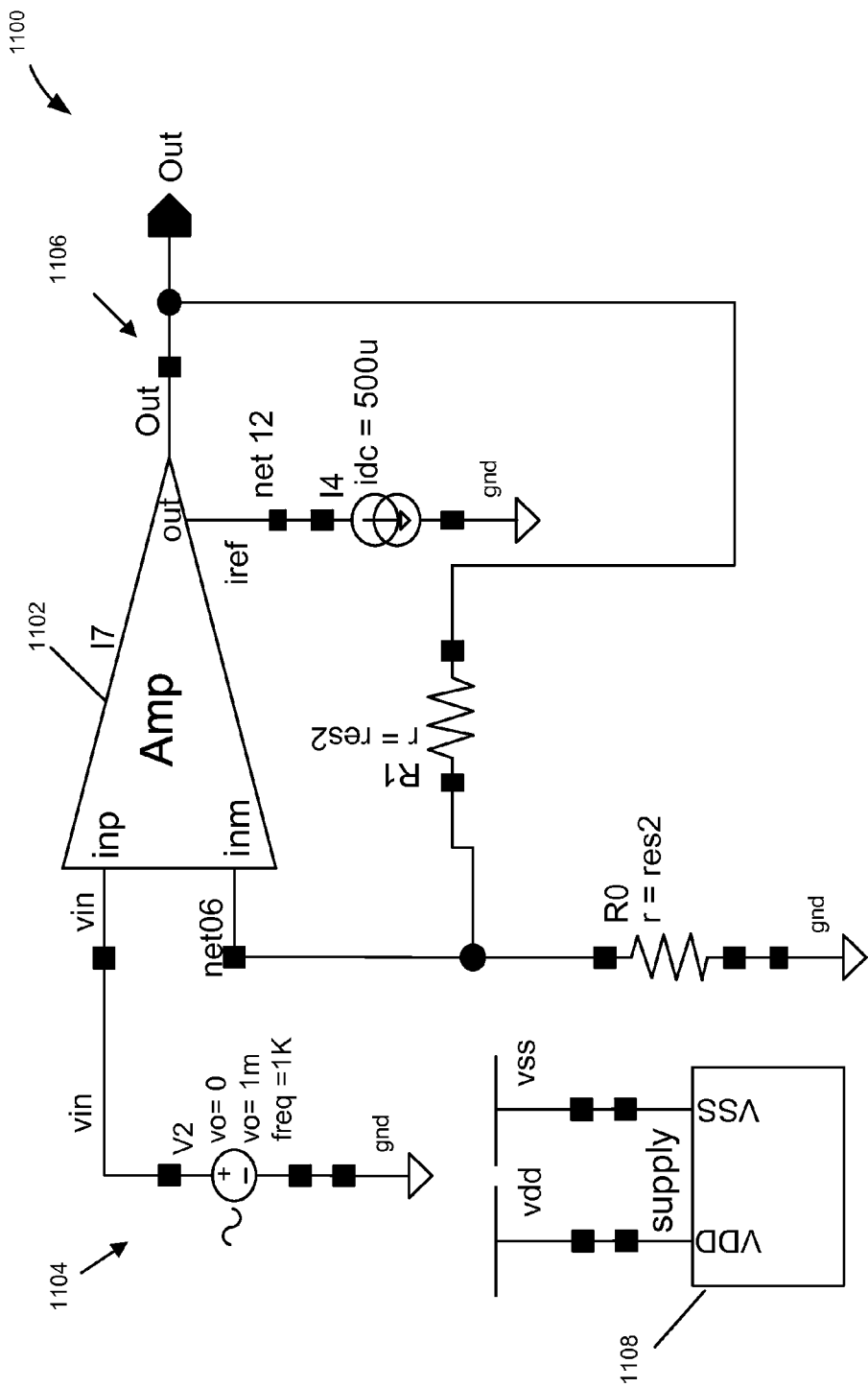
FIG. 11 is a diagram that shows an amplifier-circuit testbench for an example embodiment.

FIG. 11 is a diagram that shows an amplifier-circuit testbench 1100 for another example embodiment. As shown in FIG. 11, the amplifier-circuit testbench 1100 includes an amplifier 1102 with input elements 1104, an output elements 1106 and a power supply 1108.

FIG. 12 is a listing of a code segment that shows a netlist description for the amplifier 1102 in the amplifier-circuit testbench 1100 of FIG. 11. The code segment of FIG. 12 includes related definitions for the amplifier (lines 14-26) and the power supply (lines 4-8).

Figure 13:
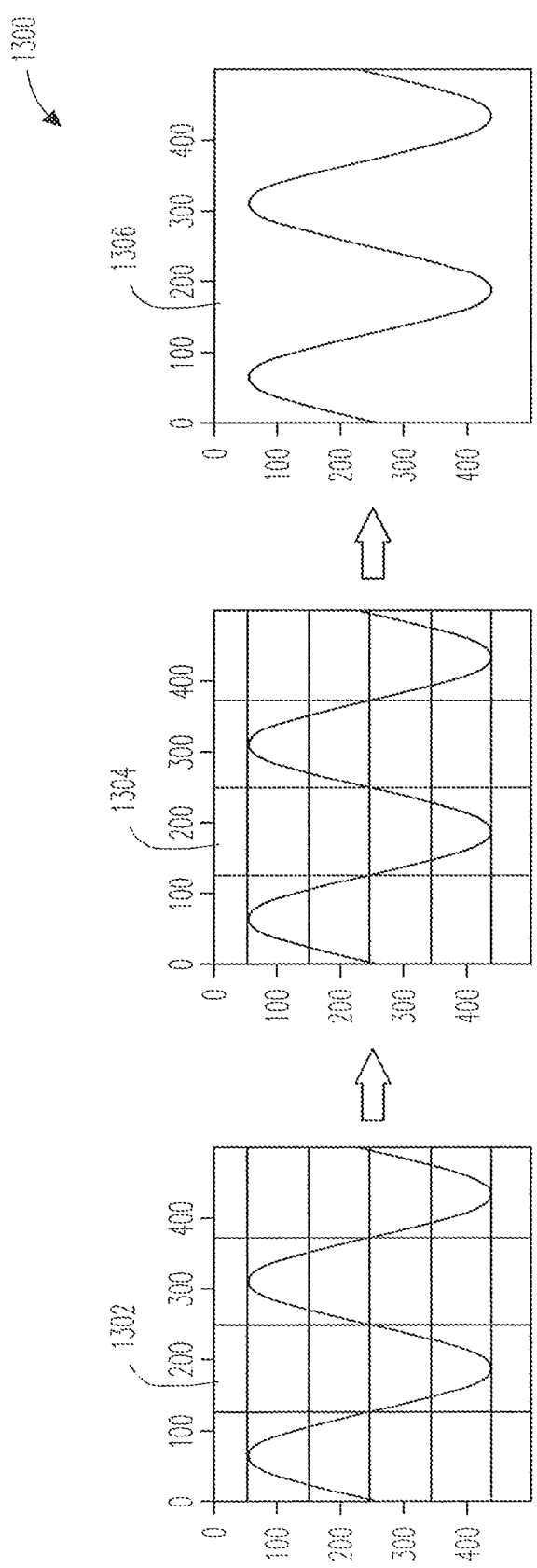
FIG. 13 is a process diagram that shows image transformations from a display image to a grayscale image after edge detection and to a black-and-white image.
Figure 14:
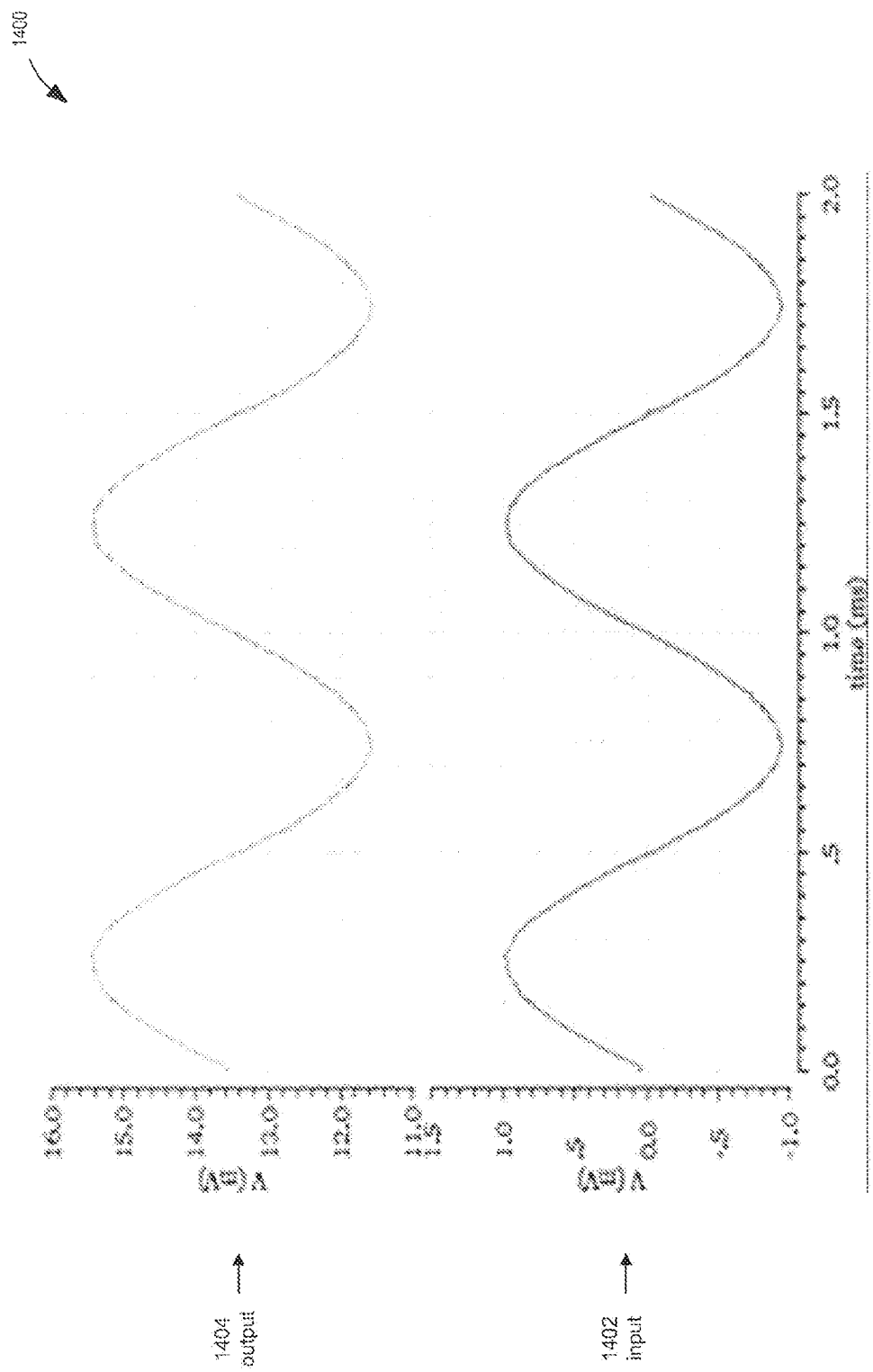
FIG. 14 is a diagram that shows a waveform display related to the amplifier-circuit testbench of FIG. 11 including an input waveform and an output waveform.

In this example embodiment, a sinusoidal voltage waveform is captured from an oscilloscope image. Similarly as in FIG. 7, FIG. 13 is a process diagram 1300 that shows image transformations from a display image 1302 to a grayscale image 1304 after edge detection and a black-and-white image 1306. Similarly as in FIG. 8, FIG. 14 is a diagram that shows a waveform display 1400 related to the amplifier-circuit testbench 1100 of FIG. 11 including an input waveform 1402 and an amplified output waveform 1404. The input waveform 1402 is a piece-wise linear (slightly noisy) waveform that interpolates the sequence of time values and stimulus values (e.g., voltages in this case) that have been extracted from the black-and-white image 1306.

Similarly as in FIG. 9, FIG. 15 is a listing of a corresponding code segment that shows example voltage inputs for the amplifier-circuit testbench 1100 of FIG. 11 including another instantiation of the Python class PWLGen that captures a graphical image for a waveform input. Here, the instance is configured to convert the "sine1kh_test.jpg" image to a piecewise linear voltage source representation, in which the (slightly noisy) impure sine-wave (e.g., image 1302 of FIG. 13) is processed and used as an input to the amplifier circuit 1102. In particular, the processing is instructed to scale image 1302 of FIG. 13 to take on X-axis (time) range of 2 milliseconds (e.g., time-scale value), with a peak-to-peak voltage or Y-axis scale of 2 millivolts (e.g., stimulus-scale value), as given by the final two parameters to the PWLGen instance.

FIG. 16 is a listing of a corresponding code segment that shows example voltage inputs for the amplifier-circuit testbench 1100 of FIG. 11 after pre-processing the code segment of FIG. 15 (e.g., by the system 1000 of FIG. 10). As shown in FIG. 16, the original Python code segment of FIG. 15 has been replaced with a netlist code segment that includes a sequence of time values and stimulus values as an input to a circuit simulator (e.g., lines 5-18, FIG. 16), where these values have been correspondingly scaled by the time-scale value and the stimulus-scale value. In this way, the Python code segment of FIG. 15 effectively consumes the image data ("sine1kh_test.jpg") to generate a piecewise linear listing that is then consumed by the circuit simulator.

Figure 17:
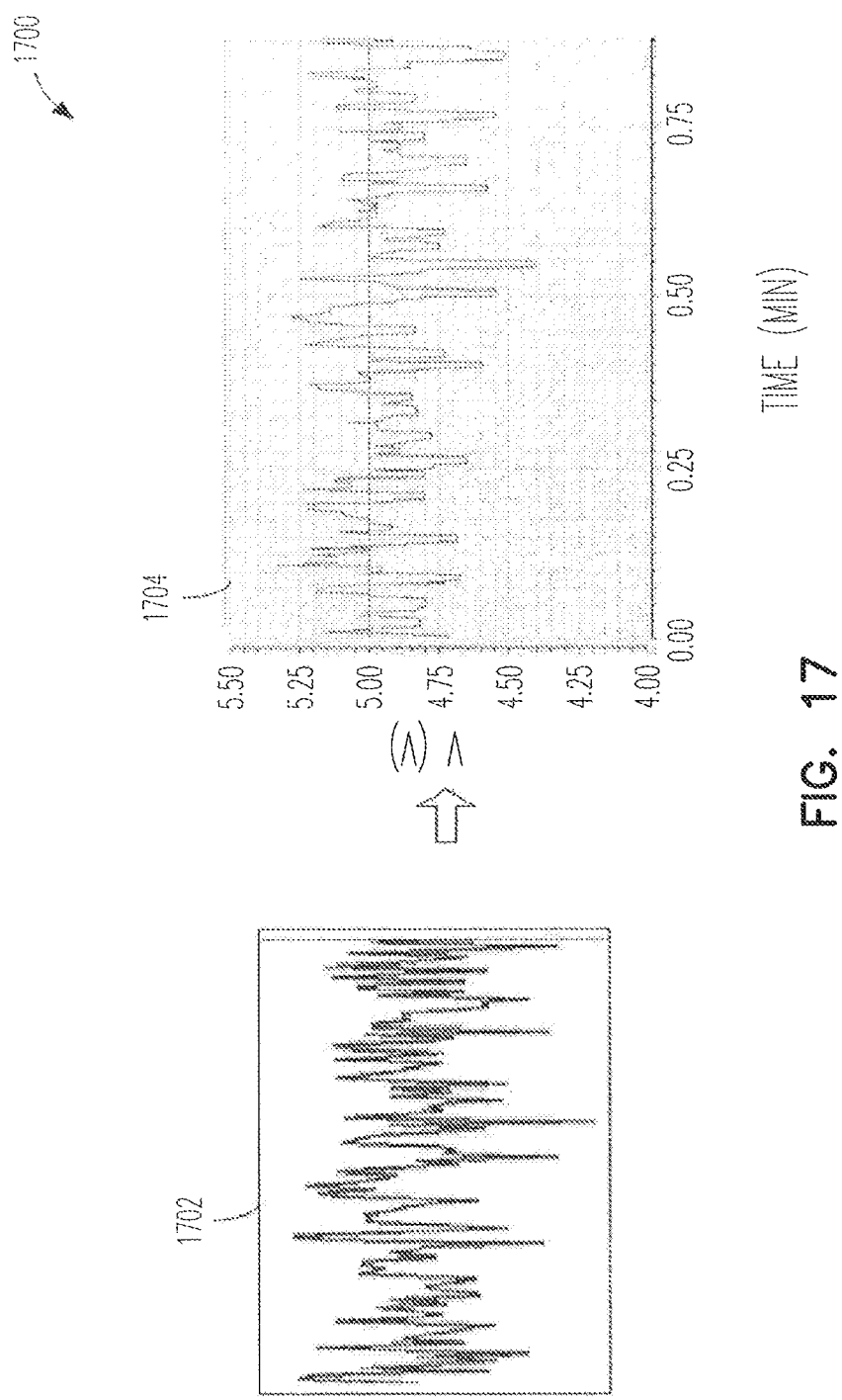
FIG. 17 is a process diagram that shows image transformations from a display image to a voltage waveform for the amplifier-circuit testbench of FIG. 11 in accordance with an example embodiment.
Figure 18:
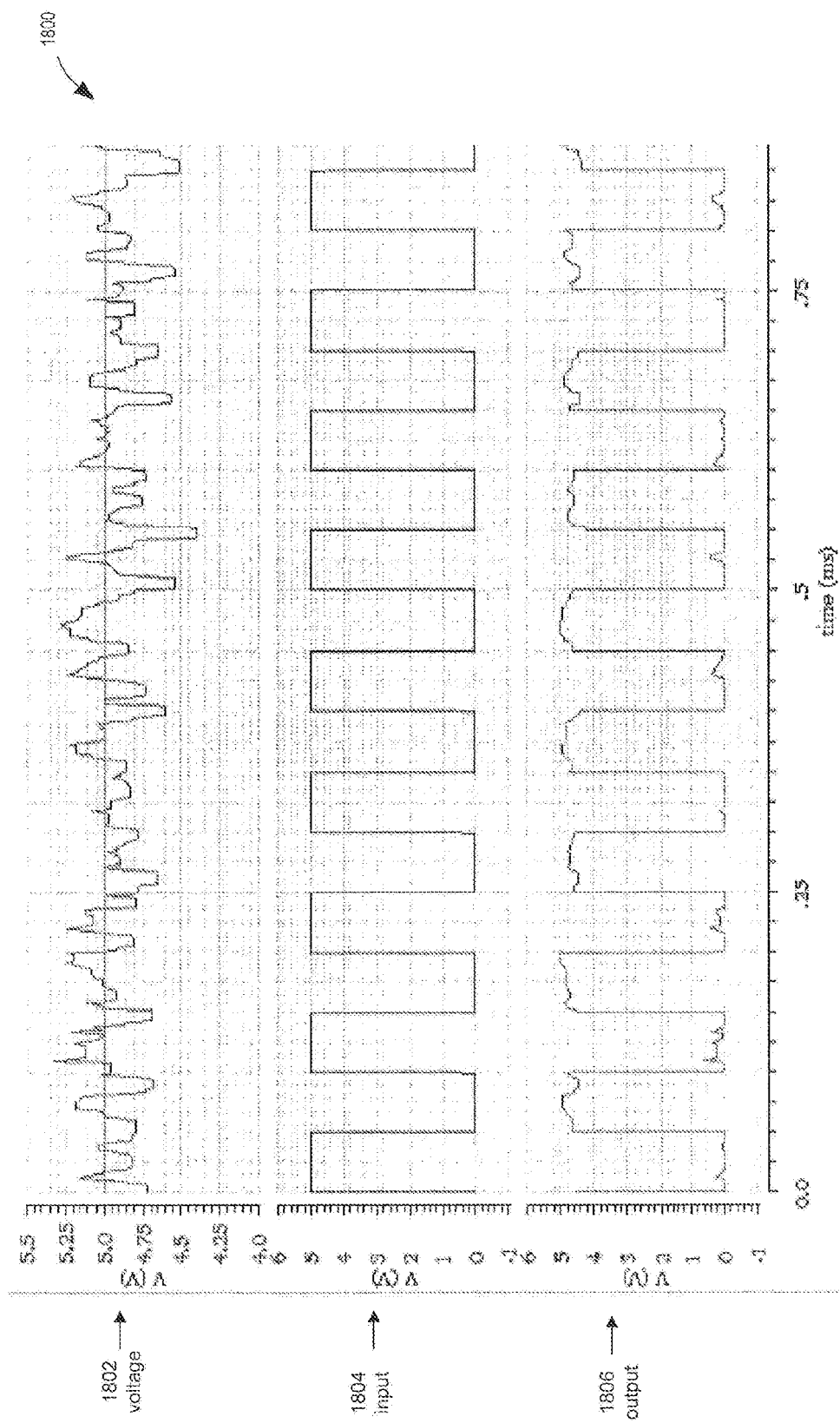
FIG. 18 is a diagram that shows a waveform display related to the amplifier-circuit testbench of FIG. 11 including a voltage waveform, an input waveform and an output waveform.

FIG. 17 is a process diagram 1700 that shows image transformations from a display image 1702 to a voltage waveform 1704 for the amplifier-circuit testbench 100 of FIG. 1 in accordance with another example embodiment. In this case the image 1702 represents a noise signal that has been captured from a noise simulator in a drawing tool (e.g., Windows Paint). This noise signal is then added to the nominal V2 voltage from the power supply 108 of FIG. 1 to give a noisy voltage waveform 1704 (e.g., added to the constant 5V voltage waveform 402 of FIG. 4). Similarly as in FIG. 4, FIG. 18 is a diagram that shows a corresponding waveform display 1800 including a noisy voltage waveform 1802 (e.g., as in waveform 1704), an input pulse waveform 1404 (e.g., as in waveform 404 of FIG. 4) and an output waveform 1106 that reflects the noisy power supply 108. The circuit simulations shown in FIGS. 17 and 18 can be implemented by a Python-based code segment as illustrated in FIGS. 15 and 16.

Figure 19:
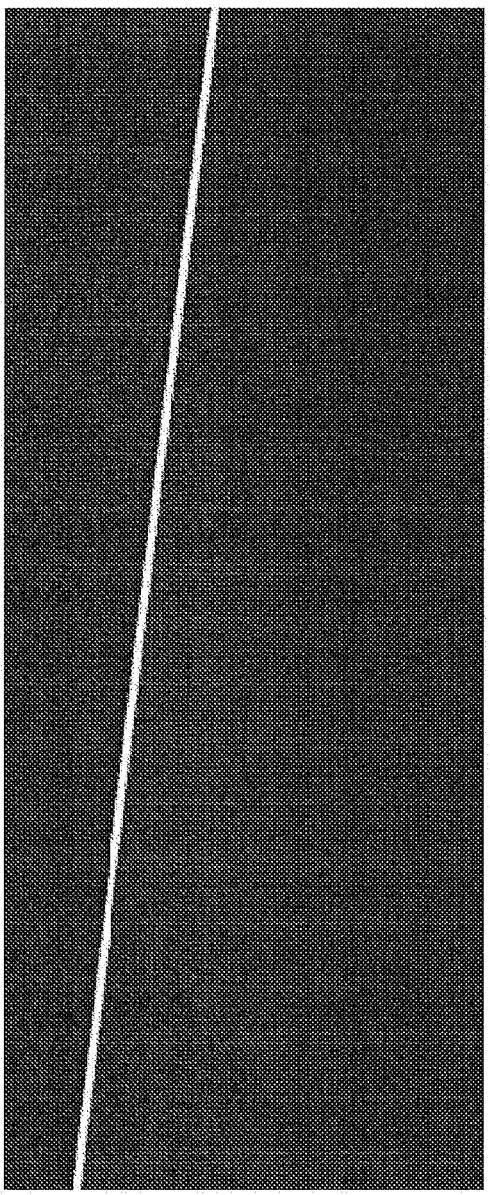
FIG. 19 is a diagram that shows a display image for a voltage profile related to the inverter-circuit testbench of FIG. 1.

FIG. 19 is a diagram that shows a display image 1900 for a voltage profile related to the inverter-circuit testbench 100 of FIG. 1 in accordance with another embodiment. In this case the image 1900 (e.g., created by a drawing tool) represents a voltage (IR) drop in the V2 voltage from the power supply 108 of FIG. 1 to model the behavior of the circuit when there is a voltage drop due to large power rail parasitic resistance and so the effective "Vdd" is reduced. As discussed above, the image 1900 is processed to determine a voltage waveform for the simulator (e.g., as in FIG. 13). FIG. 20 is a diagram that shows a corresponding waveform display 2000 including a decreasing voltage waveform 2002 (e.g., from processing the image 1900), an input waveform 2004 (e.g., as in input waveform 404), an output waveform 2006 (e.g., as in output waveform 406), a first transistor power-dissipation waveform 2010 (e.g., corresponding to transistor PM0 from lines 5-6, FIG. 2), and a second transistor power-dissipation waveform 2008 (e.g., corresponding to transistor NM0 from lines 7-8, FIG. 2).

Additional embodiments correspond to systems and related computer programs that carry out the above-described methods.

Figure 21:
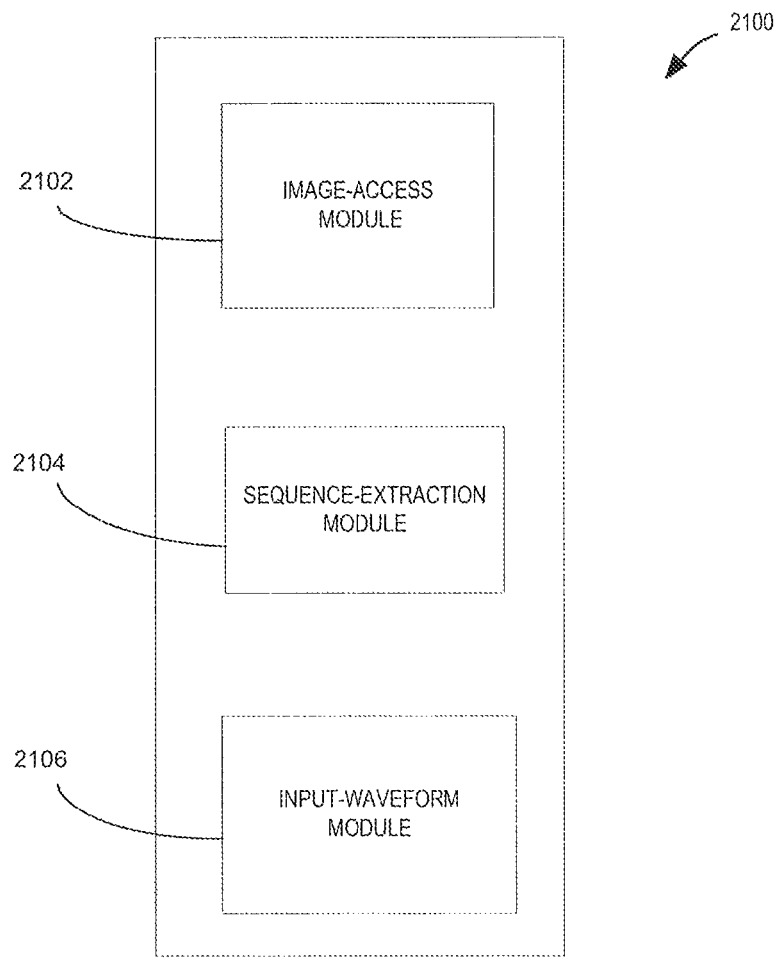
FIG. 21 is a block diagram that shows a schematic representation of an apparatus for an example embodiment.

FIG. 21 shows a schematic representation of an apparatus 2100, in accordance with an example embodiment for using an image as an input for simulating a circuit. In this case, the apparatus 2100 includes at least one computer system (e.g., as in FIG. 22) to perform software and hardware operations for modules that carry out aspects of the method 500 of FIG. 5.

In accordance with an example embodiment, the apparatus 2100 includes an image-access module 2102, a sequence-extraction module 2104, and an input-waveform module 2106. The image-access module 2106 accesses image values for the image, the image characterizing a stimulus profile for the circuit over time, and the image values including to a two-dimensional array of pixel values for the image. The sequence-extraction module 2104 extracts a sequence of time values and stimulus values for the stimulus profile from the image values, the time values being scaled by a time-scale value for a first dimension of the image, the stimulus values being scaled by a stimulus-scale value for a second dimension of the image, and the stimulus values corresponding to voltages or currents for the stimulus profile. The input-waveform module 2106 provides the sequence of time values and stimulus values as an input waveform for simulating the circuit. Additional operations related to the method 500 may be performed by additional corresponding modules or through modifications of the above-described modules.

Figure 22:
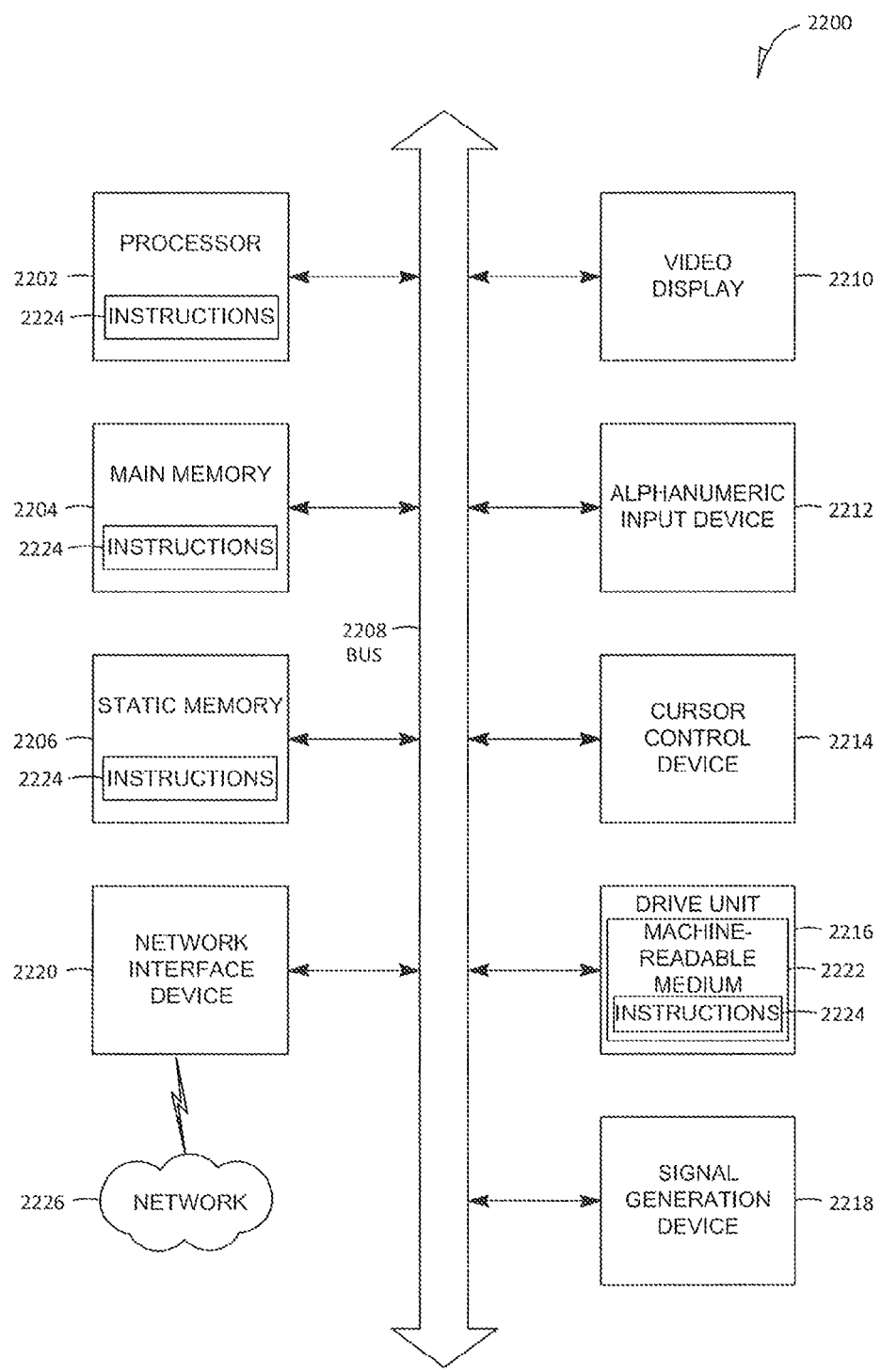
FIG. 22 is a block diagram that shows a computer processing system within which a set of instructions for causing the computer to perform any one of the methodologies discussed herein may be executed.

FIG. 22 shows a machine in the example form of a computer system 2200 within which instructions for causing the machine to perform any one or more of the methodologies discussed here may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 2200 includes a processor 2202 (e.g., a central processing unit (CPU), a graphics processing unit (GPU) or both), a main memory 2204, and a static memory 2206, which communicate with each other via a bus 2208. The computer system 2200 may further include a video display unit 2210 (e.g., a liquid crystal display (LCD) or a cathode ray tube (CRT)). The computer system 2200 also includes an alphanumeric input device 2212 (e.g., a keyboard), a user interface (UI) cursor control device 2214 (e.g., a mouse), a disk drive unit 2216, a signal generation device 2218 (e.g., a speaker), and a network interface device 2220.

In some contexts, a computer-readable medium may be described as a machine-readable medium. The disk drive unit 2216 includes a machine-readable medium 2222 on which is stored one or more sets of data structures and instructions 2224 (e.g., software) embodying or utilizing any one or more of the methodologies or functions described herein. The instructions 2224 may also reside, completely or at least partially, within the static memory 2206, within the main memory 2204, or within the processor 2202 during execution thereof by the computer system 2200, with the static memory 2206, the main memory 2204, and the processor 2202 also constituting machine-readable media.

While the machine-readable medium 2222 is shown in an example embodiment to be a single medium, the terms "machine-readable medium" and "computer-readable medium" may each refer to a single medium or multiple media (e.g., a centralized or distributed database, and/or associated caches and servers) that store the one or more sets of data structures and instructions 2224. These terms shall also be taken to include any tangible or non-transitory medium that is capable of storing, encoding or carrying instructions for execution by the machine and that cause the machine to perform any one or more of the methodologies disclosed herein, or that is capable of storing, encoding or carrying data structures utilized by or associated with such instructions. These terms shall accordingly be taken to include, but not be limited to, solid-state memories, optical media, and magnetic media. Specific examples of machine-readable or computer-readable media include non-volatile memory, including by way of example semiconductor memory devices, e.g., erasable programmable read-only memory (EPROM), electrically erasable programmable read-only memory (EEPROM), and flash memory devices; magnetic disks such as internal hard disks and removable disks; magneto-optical disks; compact disc read-only memory (CD-ROM) and digital versatile disc read-only memory (DVD-ROM).

The instructions 2224 may further be transmitted or received over a communications network 2226 using a transmission medium. The instructions 2224 may be transmitted using the network interface device 2220 and any one of a number of well-known transfer protocols (e.g., hypertext transfer protocol (HTTP)). Examples of communication networks include a local area network (LAN), a wide area network (WAN), the Internet, mobile telephone networks, plain old telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Certain embodiments are described herein as including logic or a number of components, modules, or mechanisms. Modules may constitute either software modules or hardware-implemented modules. A hardware-implemented module is a tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module (e.g., a computer-implemented module) may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" (e.g., a "computer-implemented module") should be understood to encompass a tangible entity, be that an entity that is physically constructed, permanently configured (e.g., hardwired), or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs)).

Although only certain embodiments have been described in detail above, those skilled in the art will readily appreciate that many modifications are possible without materially departing from the novel teachings of this disclosure. For example, aspects of embodiments disclosed above can be combined in other combinations to form additional embodiments. Accordingly, all such modifications are intended to be included within the scope of this disclosure.

What is claimed is:

1. A method of using an image as an input for simulating a circuit, the method comprising:

accessing image values for the image, the image characterizing a stimulus profile for the circuit over time, and the image values including a two-dimensional array of pixel values for the image;

extracting a sequence of time values and stimulus values for the stimulus profile from the image values, the time values being scaled by a time-scale value for a first dimension of the image, the stimulus values being scaled by a stimulus-scale value for a second dimension of the image, and the stimulus values corresponding to voltages or currents for the stimulus profile; and providing the sequence of time values and stimulus values as an input waveform for simulating the circuit.

2. The method of claim 1, wherein extracting the sequence includes:
applying an edge-detection filter to the image values to identify pixel-value transitions that correspond to a boundary of the stimulus profile; and
using the pixel-value transitions to identify the time values and the stimulus values corresponding to the stimulus profile.

3. The method of claim 2, wherein
the edge-detection filter includes a grayscale filter that determines grayscale image values for the image by comparing one or more grayscale threshold values to the image values, the grayscale image values including a two-dimensional array of grayscale pixel values, and
the edge-detection filter operates to identify transitions in the grayscale pixel values to identify the boundary of the stimulus profile.

4. The method of claim 1, wherein extracting the sequence includes applying a monotonicity filter that that restricts the sequence to be monotonic in the time values.

5. The method of claim 1, wherein providing the sequence of time values and stimulus values as an input waveform includes:
adding the sequence to a netlist description for simulating the circuit as a piecewise-linear waveform that interpolates the time values and the stimulus values.

6. The method of claim 1, wherein accessing the image values includes scanning a display of the image to determine the image values.

7. The method of claim 1, wherein extracting the sequence includes:
applying a grayscale filter to the image values to determine first grayscale image values for the image by comparing one or more grayscale threshold values to the image values, the first grayscale image values including a two-dimensional array of first grayscale pixel values;
applying an edge-detection filter to the first grayscale image values to determine second grayscale image values for the image by calculating transitions between the first grayscale image values, the second grayscale image values including a two-dimensional array of second grayscale pixel values;
applying a black-and-white filter to the second grayscale image values to determine black-and-white image values for the image by comparing one or more black-and-white threshold values to the second grayscale image values, the black-and-white image values including a two-dimensional array of black-and-white pixel values that each correspond to black or white; and
applying a profiling filter to the black-and-white image values to extract the sequence of time values and stimulus values by identifying black-and-white pixel values that correspond to the stimulus profile in the black and white image.

8. A non-transitory computer-readable medium that stores a computer program for using an image as an input for simulating a circuit, the computer program including instructions that, when executed by a computer, cause the computer to perform operations comprising:
accessing image values for the image, the image characterizing a stimulus profile for the circuit over time, and the image values including a two-dimensional array of pixel values for the image;
extracting a sequence of time values and stimulus values for the stimulus profile from the image values, the time values being scaled by a time-scale value for a first dimension of the image, the stimulus values being scaled by a stimulus-scale value for a second dimension of the image, and the stimulus values corresponding to voltages or currents for the stimulus profile; and
providing the sequence of time values and stimulus values as an input waveform for simulating the circuit.

9. The computer-readable medium of claim 8, wherein extracting the sequence includes:
applying an edge-detection filter to the image values to identify pixel-value transitions that correspond to a boundary of the stimulus profile; and
using the pixel-value transitions to identify the time values and the stimulus values corresponding to the stimulus profile.

10. The computer-readable medium of claim 9, wherein
the edge-detection filter includes a grayscale filter that determines grayscale image values for the image by comparing one or more grayscale threshold values to the image values, the grayscale image values including a two-dimensional array of grayscale pixel values, and
the edge-detection filter operates to identify transitions in the grayscale pixel values to identify the boundary of the stimulus profile.

11. The computer-readable medium of claim 8, wherein extracting the sequence includes applying a monotonicity filter that that restricts the sequence to be monotonic in the time values.

12. The computer-readable medium of claim 8, wherein providing the sequence of time values and stimulus values as an input waveform includes:
adding the sequence to a netlist description for simulating the circuit as a piecewise-linear waveform that interpolates the time values and the stimulus values.

13. The computer-readable medium of claim 8, wherein accessing the image values includes scanning a display of the image to determine the image values.

14. The computer-readable medium of claim 8, wherein extracting the sequence includes:
applying a grayscale filter to the image values to determine first grayscale image values for the image by comparing one or more grayscale threshold values to the image values, the first grayscale image values including a two-dimensional array of first grayscale pixel values;
applying an edge-detection filter to the first grayscale image values to determine second grayscale image values for the image by calculating transitions between the first grayscale image values, the second grayscale image values including a two-dimensional array of second grayscale pixel values;
applying a black-and-white filter to the second grayscale image values to determine black-and-white image values for the image by comparing one or more black-and-white threshold values to the second grayscale image values, the black-and-white image values including a two-dimensional array of black-and-white pixel values that each correspond to black or white; and
applying a profiling filter to the black-and-white image values to extract the sequence of time values and stimulus values by identifying black-and-white pixel values that correspond to the stimulus profile in the black and white image.

15. An apparatus configured to use an image as an input for simulating a circuit, the apparatus comprising at least one computer configured to perform operations for computer-executable modules including:

an image-access module that accesses image values for the image, the image characterizing a stimulus profile for the circuit over time, and the image values including a two-dimensional array of pixel values for the image;

a sequence-extraction module that extracts a sequence of time values and stimulus values for the stimulus profile from the image values, the time values being scaled by a time-scale value for a first dimension of the image, the stimulus values being scaled by a stimulus-scale value for a second dimension of the image, and the stimulus values corresponding to voltages or currents for the stimulus profile; and an input-waveform module that provides the sequence of time values and stimulus values as an input waveform for simulating the circuit.

16. The apparatus of claim 15, wherein extracting the sequence includes:

applying an edge-detection filter to the image values to identify pixel-value transitions that correspond to a boundary of the stimulus profile; and using the pixel-value transitions to identify the time values and the stimulus values corresponding to the stimulus profile.

17. The apparatus of claim 16, wherein the edge-detection filter includes a grayscale filter that determines grayscale image values for the image by comparing one or more grayscale threshold values to the image values, the grayscale image values including a two-dimensional array of grayscale pixel values, and the edge-detection filter operates to identify transitions in the grayscale pixel values to identify the boundary of the stimulus profile.

18. The apparatus of claim 15, wherein extracting the sequence includes applying a monotonicity filter that that restricts the sequence to be monotonic in the time values.

19. The apparatus of claim 15, wherein providing the sequence of time values and stimulus values as an input waveform includes:

adding the sequence to a netlist description for simulating the circuit as a piecewise-linear waveform that interpolates the time values and the stimulus values.

20. The apparatus of claim 15, wherein accessing the image values includes scanning a display of the image to determine the image values.

21. The apparatus of claim 15, wherein extracting the sequence includes:

applying a grayscale filter to the image values to determine first grayscale image values for the image by comparing one or more grayscale threshold values to the image values, the first grayscale image values including a two-dimensional array of first grayscale pixel values;

applying an edge-detection filter to the first grayscale image values to determine second grayscale image values for the image by calculating transitions between the first grayscale image values, the second grayscale image values including a two-dimensional array of second grayscale pixel values;

applying a black-and-white filter to the second grayscale image values to determine black-and-white image values for the image by comparing one or more black-and-white threshold values to the second grayscale image values, the black-and-white image values including a two-dimensional array of black-and-white pixel values that each correspond to black or white; and applying a profiling filter to the black-and-white image values to extract the sequence of time values and stimulus values by identifying black-and-white pixel values that correspond to the stimulus profile in the black and white image.

\* \* \* \* \*